United States Patent [19]

Leach, Jr.

[11] 4,028,671
[45] June 7, 1977

[54] CHARGE COUPLED STORAGE DEVICE MULTIPLEXER

[75] Inventor: George S. Leach, Jr., Phoenix, Ariz.

[73] Assignee: Motorola, Inc., Chicago, Ill.

[22] Filed: Oct. 6, 1975

[21] Appl. No.: 620,089

[52] U.S. Cl. .............................. 340/173 R; 357/24; 307/221 C
[51] Int. Cl.² ........................................ G11C 11/40
[58] Field of Search .................. 340/173 R; 357/24; 307/221 C, 223, 224

[56] References Cited

UNITED STATES PATENTS 3,889,245   6/1975   Gosney .......................... 340/173 R

OTHER PUBLICATIONS

"A Recirculating CCD w/ Novel Input & Output Structures" A. L. Lancaster et al., International Electronics Devices Meeting Report, Dec. 1974, pp. 108–111.
"Charge Coupled Devices in Signal Processing Systems" NTIS, Dept. of Commerce, Doc. No. AD 782574, Sect. 4.4, July 1974, pp. 4–20.

Primary Examiner—Terrell W. Fears
Attorney, Agent, or Firm—Kenneth R. Stevens

[57] ABSTRACT

The number of devices and integrated circuit area required to enter new data or to recirculate data in a charge coupled storage memory is reduced by employing separated charge source areas interconnected to selective enabling means and appropriate phasing signals.

8 Claims, 8 Drawing Figures

4,028,671

CHARGE COUPLED STORAGE DEVICE MULTIPLEXER

BACKGROUND OF THE INVENTION

The prior art circuit shown in FIG. 1 illustrates conventional techniques for entering new data or recirculating data in a charge coupled device memory. In actual circuit implementation this approach requires a great number of devices and thus increases cost and decreases densities.

It is therefore an object of the present invention to provide data transferring circuitry for a charge coupled storage memory which permits increased densities when implemented in integrated circuit form and further allows faster transfer of information.

DESCRIPTION OF THE PREFERRED EMBODIMENT

Figure 1:
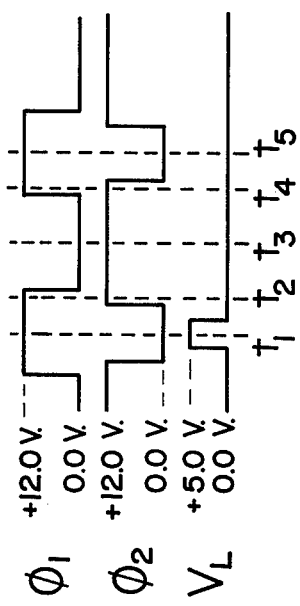
FIG. 1 shows a conventional prior art logic circuit for either entering new data or recirculating data in a charge coupled device memory.

From FIG. 1 it can be seen that in a conventional charge coupled device circuit having a new data input line 10, mode line 12, and CCD line 14, representing the output connection from the last stage of a charge coupled recirculating memory, are selectively connected to a pair on AND gates 16 and 18 and to an inverter 20. The outputs from the AND gates 16 and 18 are connected to an OR gate 21. An output terminal 22 from the OR gate 21 couples to the input stage of a charge coupled device of recirculating memory. In normal operation the recirculating memory is either recirculating data that has been previously stored in the memory or in the alternative new data is introduced into the memory.

When data previously entered in the memory is being recirculated data signals from the last stage of the memory are coupled to line 14 and the inverter 20 enables AND gate 18 by means of an appropriate signal on mode line 12 to energize line 24 in order to allow the information to pass through OR gate 21 and to the input stage of the memory via line 22. Alternatively, if new data is to be entered into the charge coupled device recirculating memory the mode line 12 disables AND gate 18 and enables AND gate 16 in order to allow new data received on line 10 to pass to the input stage of the recirculating register via OR gate 21 and line 22. When this type of circuit is implemented in MOS technology it requires anywhere from 10 to 12 devices and accordingly requires a significant amount of semiconductor chip area. Also, it can be seen that at least two stages of logic delay are required before data can be entered into the first stage of the charge coupled device recirculating register.

Figure 7:
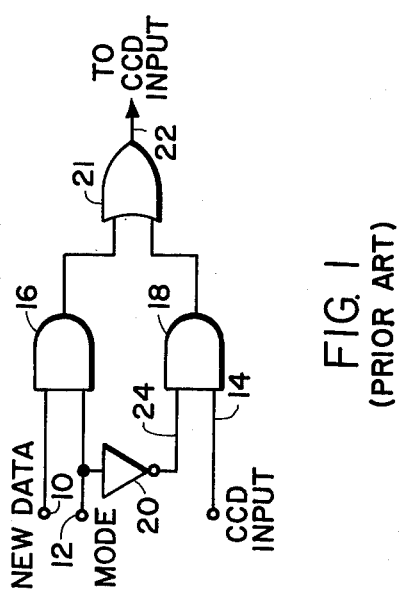
FIG. 7 is a timing diagram wherein times $t1$ through $t5$ correspond respectively to signal and voltage conditions for the operation of FIGS. 2–6.

A brief description of FIGS. 2–5 basically illustrating the general phenomena of a charge coupled device, and the accompanying timing diagram designated in times $t1$ through $t5$ will now be discussed. Each of the times $t1$–$t5$ correspond to the signal and voltage conditions for the operation of the structure of FIGS. 2–6, respectively. FIGS. 2–5 show the basic circuit structure and comprises a P-substrate 30, and N+ source diffused region 32 and output N+ diffused region 34. The source 32 is biased by a positive supply voltage $V_S$ of approximately +2.0 volts via terminal 36. A gate terminal 38 is coupled to a logic signal $V_L$ which selectively varies between approximately +5.0 volts and zero volts. The second pair of gate terminals 40 and 42 couple to the 1 clock signals at terminal 44 and as is illustrated in FIG. 7 is selectively varied between approximately +12.0V and 0.0 volts. Similarly, gate electrodes 50 and 52 are commonly coupled to the 2 clock signals via terminal 54. Again, as illustrated in FIG. 7, the 2 clock signals are selectively switched between +12.0 volts and 0.0 volts. The charge is ultimately delivered to output terminal 60 coupled to N+ diffused region 34. In the schematic depictions the lower gate terminals in an actual implementation are constituted by doped polysilicon gate electrodes while the upper gate electrodes are constituted by metal gate electrodes.

Figure 4:
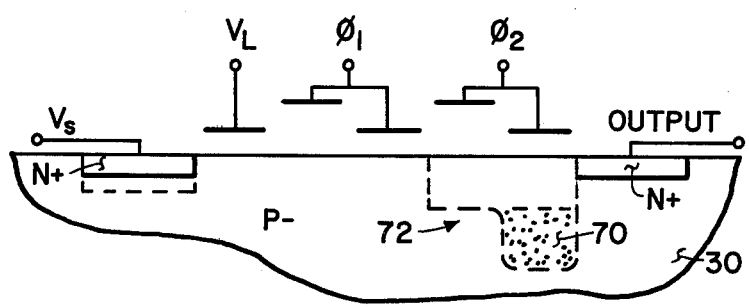

Under the n+ source region 32 is a dotted region 64 which represents a depletion region created by the application of the +2.0 biasing voltage $V_S$ applied to terminal 36 and similar conventions are employed for other areas and in each of the FIGS. 2–6. At time $t1$ launch voltage $V_L$ of approximately +5.0 volts is applied to the gate terminal 38 via terminal 65 nd simultaneiously therewith the 1 clock signal of approximately +12.0 volts is applied to terminal 44. It is to be noted that even though at time $t1$ the 2 clock signals are at a down or 0.0 voltage level in order for charge to be successfully transferred there must be a slight overlap between the 1 and 2 signals. Thus, with the voltage and signal conditions established at time $t1$ a depletion region 64 is established under the source region 32 and separated therefrom and located beneath the 1 gate electrodes is another depletion region 66. Due to the charge coupled phenomena a pocket or well of charge is stored within the depletion region 66 as is indicated at 68. At time $t2$ and referring to FIG. 3 it can be seen that the launch voltage $V_L$ has now been turned off and both the 1 and 2 signals are at a high level in order to generate a depletion region 70 again depicted by dotted lines. The charge however remains in the previous location or well 68. At time $t3$ the 1 signal is completely turned off and the 2 signal is high and thus the depletion region underneath the 1 gate electrodes is removed and the charge is now transferred within a new well 70 within a depletion region 72 now residing underneath the 2 gate electrodes as shown in FIG. 4.

Figure 5:
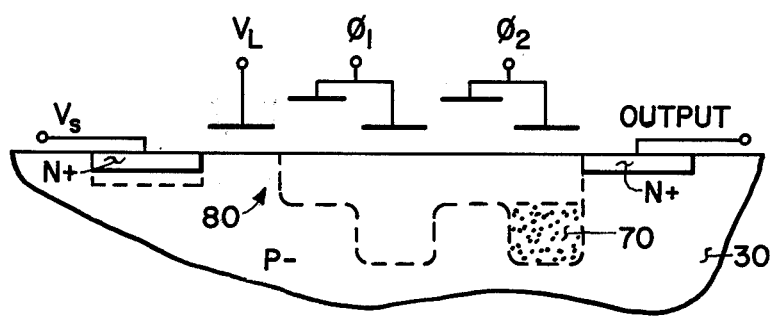

At time $t4$ the 1 signal is again turned on and at this time both 1 and 2 signals are at a high level in order to generate a depletion 80 and where the charge is still stored in well 70, as shown in FIG. 5.

Figure 6:
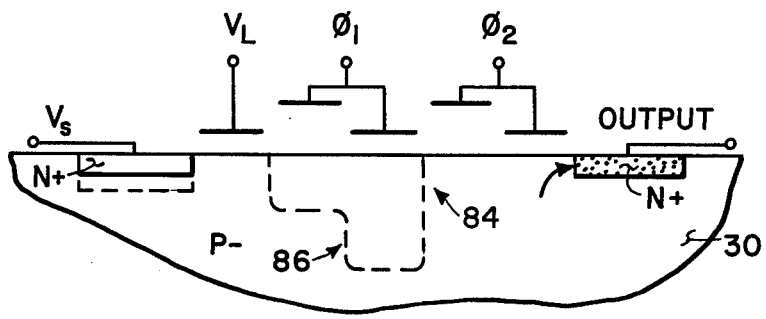

In FIG. 6 there are two occurrences. The launch voltage at this time is left at a down or 0.0 level to signify that a down or low logic signal is being written into this cell position. Consequently, the depletion pattern 84 generated under the 1 gate electrodes do not possess any charge in the well area 86. Simultaneously, at the t5 occurrence the charge that has been previously stored in well 70 is transferred to the output terminal 60 via the N+ region 34.

Figure 8:
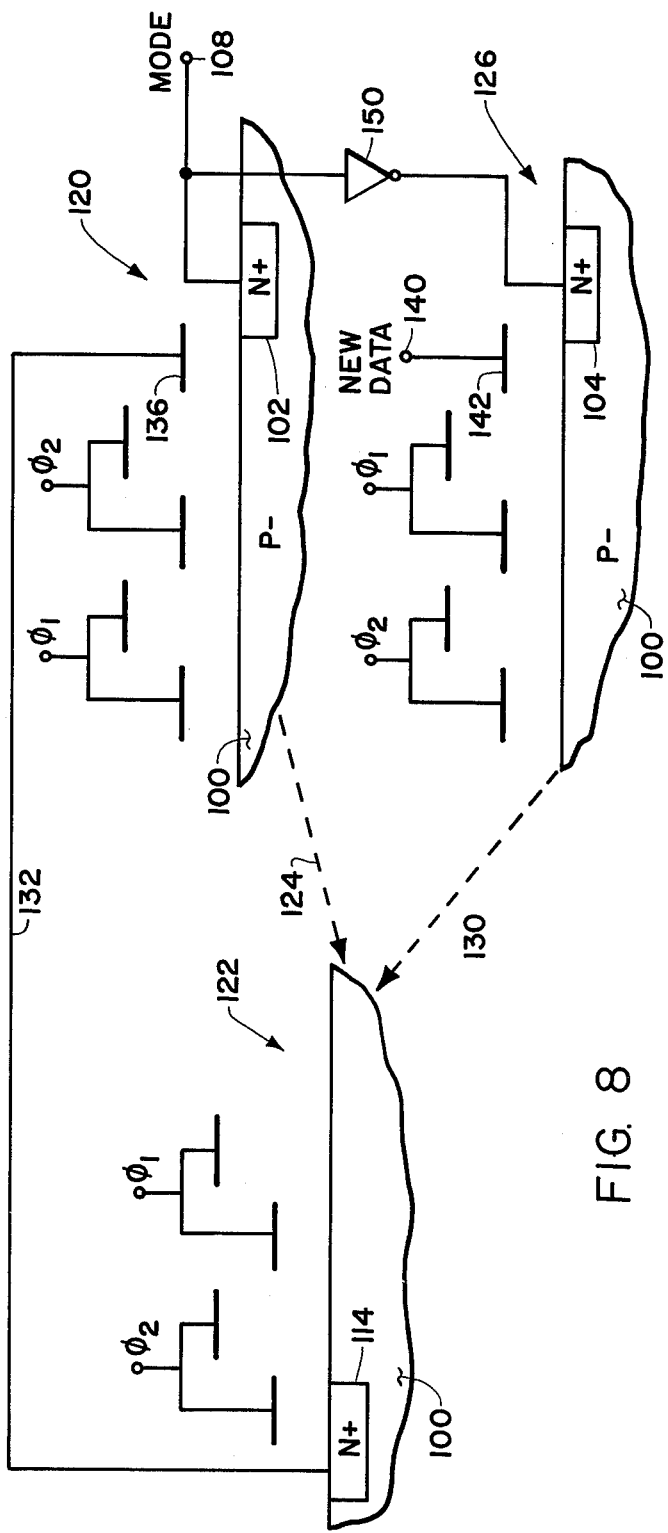
FIG. 8 illustrates a preferred embodiment of the present invention for reading or recirculating data in a charge coupled device memory. The memory cell is illustrated as a two stage register and of course could be expanded to any number of stages.
Figure 2:
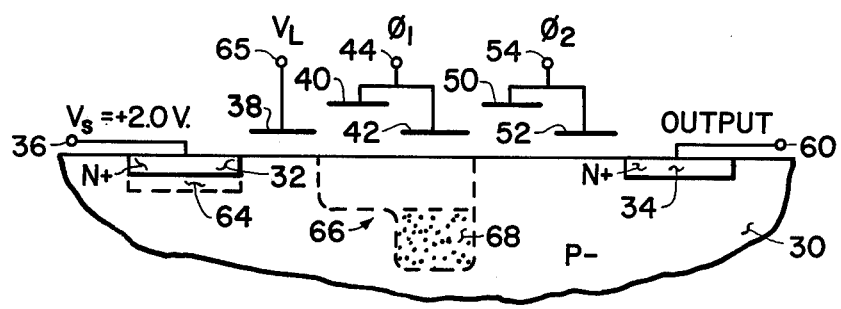
FIGS. 2–6 in partial cross-section show a semiconductor substrate and the manner in which charge is transferred between a source and an output terminal for a prior art single stage charge coupled device.
Figure 3:
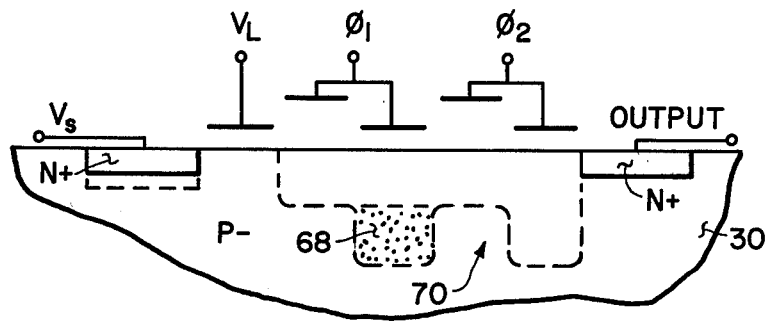

Now referring to FIG. 8, it illustrates the manner in which the basic phenomenon of charge coupled devices is employed to reduce the devices required to enter information into a recirculating charge coupled device memory and also increase the writing speed. It is to be realized that the FIG. 8 schematic diagram depicts three separate integrated circuit locations but which are in fact located on the same semiconductor substrate and this form of illustration is simply for purposes of clarity and simplicity. For the same reasons only a two bit recirculating charge coupled device memory cell is shown, but it is to be appreciated that any number of cells or register positions could be implemented employing the present invention.

Similar conventions used to describe FIGS. 2–6 are also employed in FIG. 8. A P-substrate 100 includes a pair of source regions 102 and 104 which are separated from each other on the same substrate 100. The N+ diffused regions 102 and 104 essentially function in the same capacity as that of the source 32 previously described with respect to FIG 2 and 6. Region 102 is directly coupled to mode control line 108 and region 104 is coupled to mode control line 108 via inverter 150. A third diffused output region 114 in substrate 100 is an output region which again operates in a manner similar to output region 34 previously described with reference to FIGS. 2–6. Thus, FIG. 8 can really be viewed as a two stage charge coupled device recirculating register wherein information is transferred either from input cell 120 to the output cell 122 schematically depicted by dashed line 124 under control of mode terminal 108 or information is transmitted from a dual input cell 126 to the output cell 122 as schematically depicted by dashed line 130. Again it is to be emphasized that the actual transfer of charge schematically depicted by lines 124 and 130 would occur through the substrate 100.

A feedback line 132 connects the output stage N+ region 114 to one of the input stages 120 at gate 136. The gate electrode 136 again is equivalent in operation to the launch gate previously described with respect to FIGS. 2–6. New data is entered into the alternate input cell or bit position via input terminal 140 connects to gate electrode 142 disposed over N+ region 104. The gate electrodes 136 and 142 function to receive selective voltage levels similar to the voltage levels previously described in FIGS. 2–6 as the $V_L$ voltage. The mode terminal or line 108 functions to selectively apply a bias voltage to either region 102 or to region 104 and thus is equivalent in function to the biasing voltage $V_s$ which was used to create the depletion region under the source region 32 in the previous figures. Each of the input stages 120 and 126 each include 01 and 02 clocking signals and output stage 122 also similarly includes 01 and 02 clocking signals which are applied to their respective commonly coupled gate electrodes as previously described. Data can be entered into the memory by selectively controlling mode terminal 108. The appropriate signal on mode line 108 causes region 104 to be disabled and does not receive a bias voltage. Thus no charge or new data can be entered at terminal 140. Similarly, while region 104 is disabled region 102 is receiving a bias voltage and is capable of recirculating data generated from output stage 122 at region 140 and accepting it at gate 136 in conjunction with its 01 and 02 signals in the same manner as previously described with respect to FIGS. 2–6.

Similarly, if new data is to be entered into the charge coupled device recirculating shift register an opposite mode control signal is applied to mode terminal 108 so as to disable region 102 and enable region 104 via inverter 150. Accordingly, new data can be entered into input cell or bit position 126 via terminal 140 and transferred to the output stage 122 in the manner as described with reference to the previous figures.

Thus it can be seen that as opposed to the prior art structure of FIG. 1 only a single inverter 150 is required to control the writing of information into the charge coupled device memory. Concededly, an additional input cell is required, in other words conventional charge coupled device memories only require a single input stage. However, the actual semiconductor area necessary to accommodate an extra source region and the additional five gate electrodes is extremely small as compared to the semiconductor area that would be required to implement the prior logic circuit of FIG. 1. Also, the embodiment of FIG. 8 can operate at higher speeds since the two stages of delay inherent in the logic circuit of FIG. 1 are essentially removed from the present invention.

I claim:

1. A charge coupled device memory having a plurality of charge coupled device stages comprising:
   a. a semiconductor substrate,
   b. a first and second separated region of a first conductivity type disposed in said substrate each forming respectively a portion of a pair of input stages,
   c. a third region of first conductivity type disposed in said substrate forming a portion of another stage, and said another stage being coupled to both input stages through a plurality of other charge coupled device stages, and
   d. enabling means coupled to said first and second regions for selectively recirculating data in a recirculating mode or for entering new data into a write mode of the memory.

2. A charged coupled device memory having a plurality of stages as in claim 1 wherein:
   a. said enabling means comprises means for selectively biasing said first region during a recirculating mode and for selectively biasing said second region during a write mode.

3. A charged coupled device memory having a plurality of stages as in claim 2 further including:
   a. a plurality of gate electrodes disposed over said substrate coupled to clock sources for selectively transferring data either in the recirculating mode or in the write mode.

4. A charged coupled device memory having a plurality of stages as in claim 3 wherein:
   a. each of said stages comprises a source region and a separated output region disposed in said substrate and a plurality of gate electrodes and disposed therebetween, and
   b. said first and second separated regions constituting source regions and said third region constituting an output region.

5. A charged coupled device memory having a plurality of stages as in claim 4 wherein:
   a. said substrate comprises a P-type material and said source and output regions comprise N-type regions.

6. A charged coupled device memory having a plurality of stages as in claim 5 wherein:
 a. said enabling means comprises inverter means for selectively biasing said first region during a recirculating mode and selectively biasing said second region during a write mode.

7. A charged coupled device memory having a plurality of stages as in claim 6 further including:
 a. connection means for coupling said output region of said another stage to at least one of said pair of input stages.

8. An integrated circuit recirculating charge coupled device memory disposed with respect to a substrate having a plurality of charge coupled device stages for transferring data comprising:
 a. two of said plurality of charge coupled device stages constituting a pair of charge coupled device input stages,
 b. at least another of said plurality of charge coupled device stages electrically coupled to said pair of input stages,
 c. a further one of said plurality of charge coupled device stages for coupling said another stage to both of said input stages, and
 d. circuit means coupled to said pair of input stages for selectively transferring data.

* * * * *